(12) United States Patent
Ito et al.

(10) Patent No.: US 10,740,673 B2
(45) Date of Patent: Aug. 11, 2020

(54) SCALABLE REFRESH FOR ASYMMETRIC NON-VOLATILE MEMORY-BASED NEUROMORPHIC CIRCUITS

(71) Applicant: INTERNATIONAL BUSINESS MACHINES CORPORATION, Armonk, NY (US)

(72) Inventors: Megumi Ito, Adachi-ku (JP); Masatoshi Ishii, Yokohama (JP); Atsuya Okazaki, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/539,038

(22) Filed: Aug. 13, 2019

(65) Prior Publication Data
US 2020/0019845 A1 Jan. 16, 2020

Related U.S. Application Data

(63) Continuation of application No. 16/035,188, filed on Jul. 13, 2018, now Pat. No. 10,445,640.

(51) Int. Cl.
*G06N 3/063* (2006.01)
*G06N 3/08* (2006.01)
(Continued)

(52) U.S. Cl.
CPC .......... *G06N 3/063* (2013.01); *G06N 3/0635* (2013.01); *G06N 3/08* (2013.01); *G11C 13/004* (2013.01);
(Continued)

(58) Field of Classification Search
CPC .......... G06N 3/063; G06N 3/08; H01L 45/06; H01L 27/2463; G11C 13/0004; G11C 13/004
See application file for complete search history.

(56) References Cited

U.S. PATENT DOCUMENTS

| 2011/0116309 A1 | 5/2011 | Lung |
| 2016/0125938 A1 | 5/2016 | BrightSky et al. |
| 2018/0068217 A1 | 3/2018 | Eleftheriou et al. |

OTHER PUBLICATIONS

Bichler et al., "Visual Pattern Extraction Using Energy-Efficient "2-PCM Synapse" Neuromorphic Architecture", IEEE Transactions on Electron Devices, vol. 59, No. 8, Aug. 2012, pp. 2206-2214.
(Continued)

*Primary Examiner* — Ajay Ojha
(74) *Attorney, Agent, or Firm* — Tutunjian & Bitetto, P.C.; Vazken Alexanian

(57) ABSTRACT

A computer-implemented method is provided for refreshing cells in a Non-Volatile Memory (NVM)-based neuromorphic circuit wherein synapses are each composed of a respective cell pair formed from a respective Gp cell and a respective Gm cell of the cells. The method includes randomly selecting multiple neurons and reading a conductance of any of the synapses connected to the multiple neurons. The method further includes selecting any of the synapses connected to the selected multiple neurons for which the Gm conductance has reached a maximum conductance. The method also includes resetting the Gp cell and Gm cell of the selected synapses, and setting, at most, one of the Gp cell and Gm cell of each of the selected synapses to recover an effective total weight of each of the selected synapses.

20 Claims, 8 Drawing Sheets

(51) Int. Cl.
*H01L 45/00* (2006.01)
*H01L 27/24* (2006.01)
*G11C 13/00* (2006.01)

(52) U.S. Cl.
CPC ...... *G11C 13/0004* (2013.01); *H01L 27/2463* (2013.01); *H01L 45/06* (2013.01)

(56) References Cited

OTHER PUBLICATIONS

List of IBM Patents or Patent Applications Treated as Related dated Aug. 13, 2019, 2 pages.

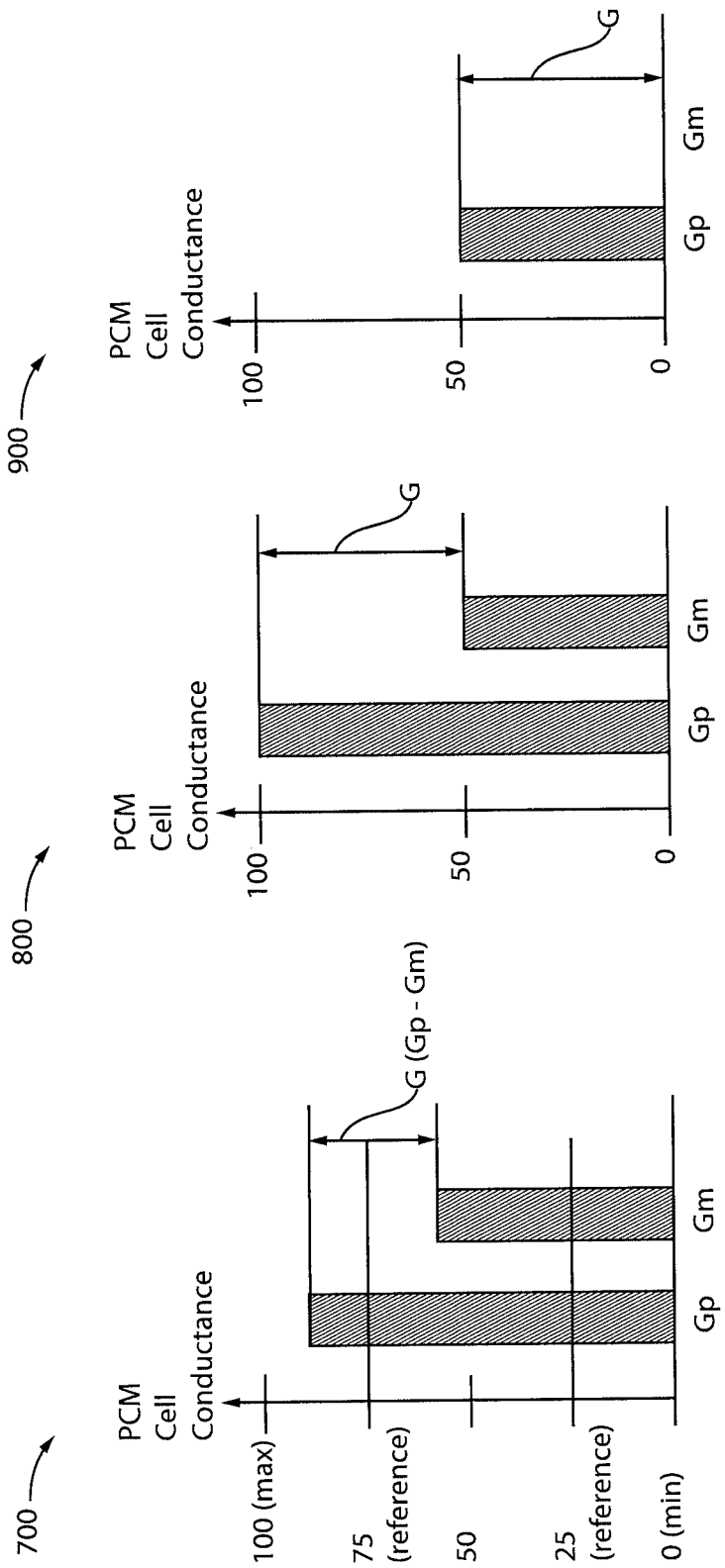

SCALABLE REFRESH FOR ASYMMETRIC NON-VOLATILE MEMORY-BASED NEUROMORPHIC CIRCUITS

BACKGROUND

Technical Field

The present invention generally relates to memory devices, and more particularly to scalable refresh for asymmetric Non-Volatile Memory (NVM)-based neuromorphic circuits.

Description of the Related Art

In Non-Volatile Memory (NVM)-based neuromorphic circuits that exploit 2-Phase Change Memories, once conductance Gp or conductance Gm reach their maximum conductance, no further valid update is possible, thus limiting the achievable accuracy of such memories. Accordingly, a refresh operation is needed to reduce these conductances while consuming a small amount of power using a small amount of supporting circuitry.

SUMMARY

According to an aspect of the present invention, a computer-implemented method is provided for refreshing cells in a Non-Volatile Memory (NVM)-based neuromorphic circuit wherein synapses are each composed of a respective cell pair formed from a respective Gp cell and a respective Gm cell of the cells. The method includes randomly selecting multiple neurons and reading a conductance of any of the synapses connected to the multiple neurons. The method further includes selecting any of the synapses connected to the selected multiple neurons for which the conductance has reached a maximum conductance. The method also includes resetting the Gp cell and Gm cell of the selected synapses, and setting, at most, one of the Gp cell and Gm cell of each of the selected synapses to recover an effective total weight of each of the selected synapses.

According to another aspect of the present invention, a neuromorphic circuit is provided. The neuromorphic circuit includes a crossbar array including cell pairs of synaptic cells. Each of the cell pairs compose a respective synapse that includes a respective Gp cell and a respective Gm cell. The neuromorphic circuit further includes a plurality of forward lines respectively connecting the synaptic cells in series to a plurality of visible neurons at ends thereof. The neuromorphic circuit also includes a plurality of backward lines respectively connecting the synaptic cells in series to a plurality of hidden neurons at ends thereof to compose a single neuron layer. The neuromorphic circuit additionally includes a weight refresh circuit for cell refreshing, including pairs of comparator circuits, each of the pairs being respectively assigned to the respective Gp cell and the respective Gm cell of a given one of the cell pairs for controlling the cell pairs by comparing a conductance of any of the synapses connected to multiple randomly selected neurons to a comparator reference voltage corresponding to a maximum conductance. The cell pairs are further controlled by selecting any of the synapses connected to the selected multiple neurons for which the conductance has reached the maximum conductance. The cell pairs are additionally controlled by resetting the Gp cell and Gm cell of the selected synapses, and setting, at most, one of the Gp cell and Gm cell of each of the selected synapses to recover an effective total weight of each of the selected synapses.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 7 is a plot showing exemplary initial Gp and Gm conductance at a refresh phase, in accordance with an embodiment of the present invention;

FIG. 8 is a plot showing exemplary PCM conductance after reading the PCM conductance, in accordance with an embodiment of the present invention;

FIG. 9 is a plot showing exemplary conductance after the refresh operation, in accordance with an embodiment of the present invention.

DETAILED DESCRIPTION

The present invention is directed to scalable refresh for asymmetric Non-Volatile Memory (NVM)-based neuromorphic circuits.

In an embodiment, the present invention provides an approach to refresh cells in NVM-based neuromorphic circuits after the cells saturate at their maximum conductance during a learning process implemented by a learning system. While one or more embodiments of the present invention are described with respect to Phase Change Memory (PCM) cells, it is to be appreciated that other types of cells can also be used in accordance with the teachings of the present invention, while maintaining the spirit of the present invention. In an embodiment, the learning system can be an event-based Restricted Boltzmann Machine (RMB) with Spike Time Dependent Plasticity (STDP) update rule using a modified contrastive divergence algorithm. Of course, other types of learning systems can also be used, while maintaining the spirit of the present invention. The refresh approach of the present invention reduces the power consumption by the NVM-based neuromorphic circuits by decreasing the number of SET and RESET programming pulses while maintaining a high learning accuracy. These and other advantages and features of the present invention are described in further detail herein below.

Figure 1:
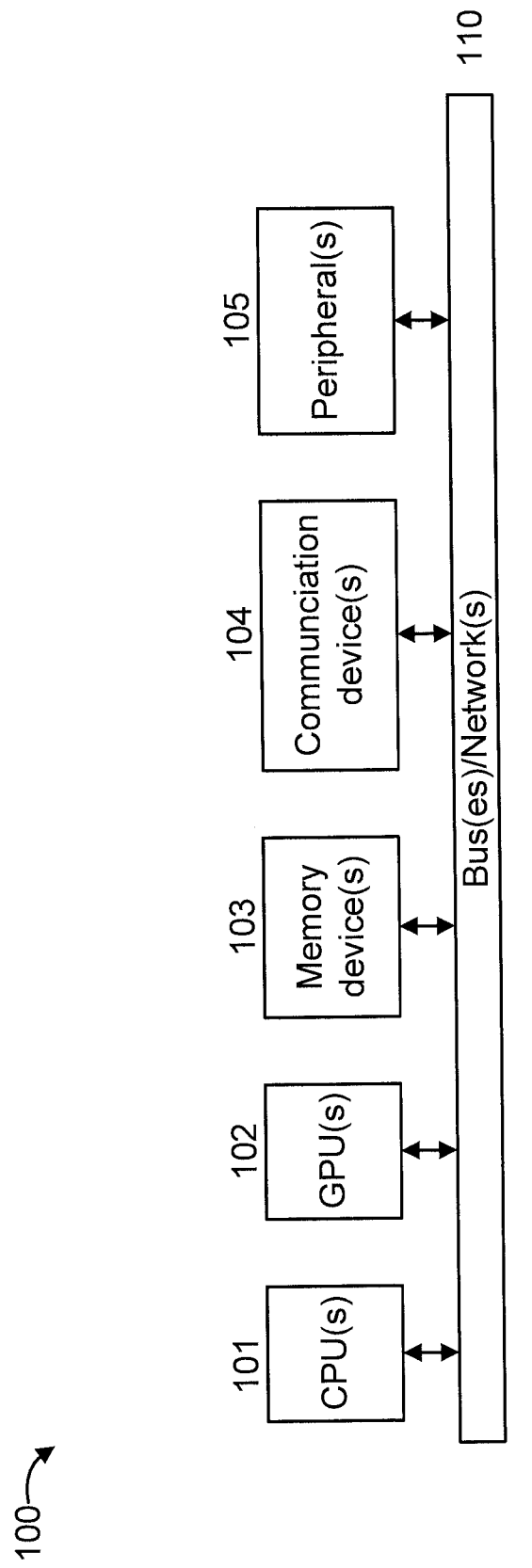
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, and so forth. Elements of processing system 100 are connected by one or more buses or networks (collectively denoted by the figure reference numeral 110). Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

Figure 2:
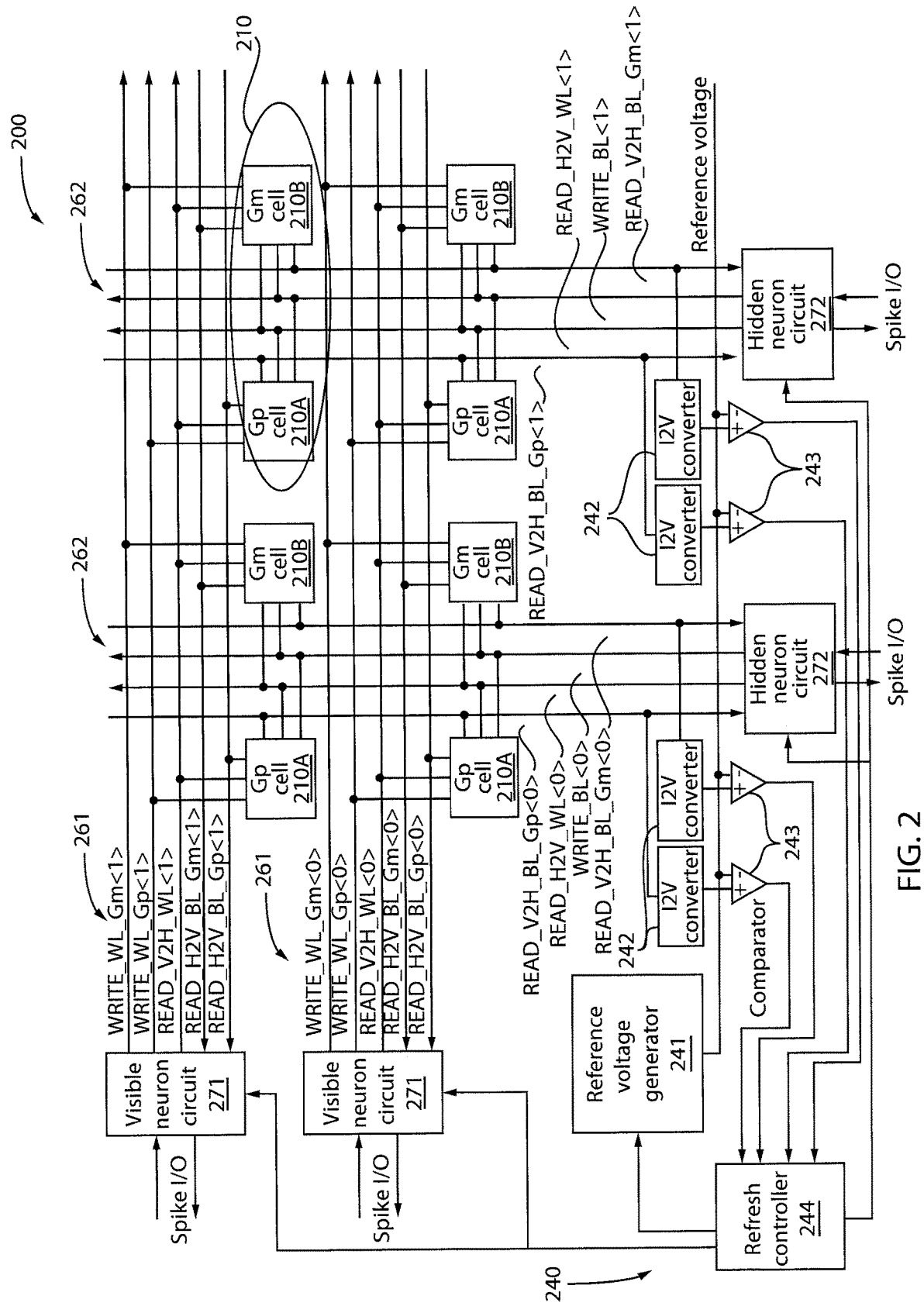
FIG. 2 is a block diagram showing an exemplary neuromorphic circuit to which the present invention can be applied, in accordance with an embodiment of the present invention.

FIG. 2 is a block diagram showing an exemplary neuromorphic circuit 200 to which the present invention can be applied, in accordance with an embodiment of the present invention. In an embodiment, the neuromorphic circuit 200 can be part of a neuromorphic chip. In an embodiment, the neuromorphic circuit 200 can be included in a computer processing system such as computer processing system 100.

The neuromorphic circuit 200 includes vertically disposed forward lines (hereinafter "forward lines") 261 and horizontally disposed backward lines (hereinafter "backward lines") 262. Each of the forward lines 261 is connected to a visible neuron circuit 271. Each of the backward lines is connected to a hidden neuron circuit 272. In FIG. 2, forward lines are WRITE_WL_Gm, WRITE_WL_Gp, READ_V2H_WL, READ_H2V_BL_Gm, and READ_H2V_BL_Gp. Backward lines are READ_V2H_BL_Gp, READ_H2V_WL, WRITE_BL, and READ_V2H_BL_Gm.

The neuromorphic circuit 200 is configured with differential 2-Phase Change Memory (2-PCM) synapses 210, such that each differential 2-PCM synapse 210 includes two synaptic PCM cells, namely a Gp cell 210A and a Gm cell 210B. The Gp cell 210A contributes to positive synaptic weight and the Gm cell 210B contributes to negative synaptic weight. That is, Gp represents positive weight, which conductance increases as the synaptic weight increases, while Gm represents negative weight, which conductance increases as the synaptic weight decreases.

Outputs (conductance Gp and conductance Gm) from the PCM cells are connected to a weight refresh circuit 240. The weight refresh circuit 240 includes a reference voltage generator 241, current to voltage converters (hereinafter "I2V converters") 242, comparators 243, and a refresh controller (hereinafter "controller") 244. An input of the reference voltage generator 241 is connected to an output of the controller 244. Other outputs of the controller 244 are connected to the visible neuron circuits 271 and the hidden neuron circuits 272. An output of the reference voltage generator 241 is connected to the inverting inputs of the comparators 243 in order to provide reference voltages to the comparators 243. Inputs of the I2V converters 242 are connected to the Gp cells 210A and the Gm cells 210B. Outputs of the I2V converters 242 are connected to non-inverting inputs of the comparators 243. The comparators 243 are configured to compare the reference voltage(s) from the reference voltage generator 241 to values of Gp and Gm from the Gp cells 210A and Gm cells 210B, respectively. Outputs of comparators 243 are connected to the controller 244. Hence, each of the comparators 243 of the weight refresh circuit 240 is respectively assigned to a respective one of the backward lines 262 (that is, each Gp cell (backward) line and each Gm cell (backward) line) for resetting/setting pairs of the asymmetric Set/Rest NVMs included in each of the synaptic cells.

Thus, neuromorphic circuit 200 includes PCM cells arranged in a crossbar array, wherein the forward lines 261 respectively connect the synaptic cells in series to the visible neuron circuits 271 at ends thereof, while the backward lines 262 respectively connect the synaptic cells in series to a set of hidden neuron circuits 272 at ends thereof to compose a single neuron layer.

The controller 244 performs various operations associated with the methods described herein. The controller 244 can be, e.g., a processing unit from FIG. 1 such as a CPU or GPU or can be a circuit block within a neuromorphic chip. Alternatively, a dedicated controller can be used. The controller 244 can be implemented by an Application Specific Integrated Circuit (ASIC) or some other hardware processing element as readily appreciated by one of ordinary skill in the art given the teachings of the present invention provided herein.

The total weight of a synapse is calculated as the sum of the corresponding two PCM cell weights (Gp-Gm). Conductance increases incrementally by a specific amount due to a SET pulse and decreases abruptly to a minimum conductance with a RESET pulse. Both Gp and Gm are operated in SET mode during the weight update with monotonically increasing conductivities. This means that Gp or Gm eventually reaches maximum conductance (i.e., conductance saturation) and no further valid update is possible, which will limit the accuracy that can be achieved.

In order to overcome this conductance saturation problem, in an embodiment, the present invention advantageously introduces a refresh operation having a reduced refresh overhead. The reduced refresh overhead is achieved by decreasing the number of refresh targets and improving the refresh operation.

Figure 3:
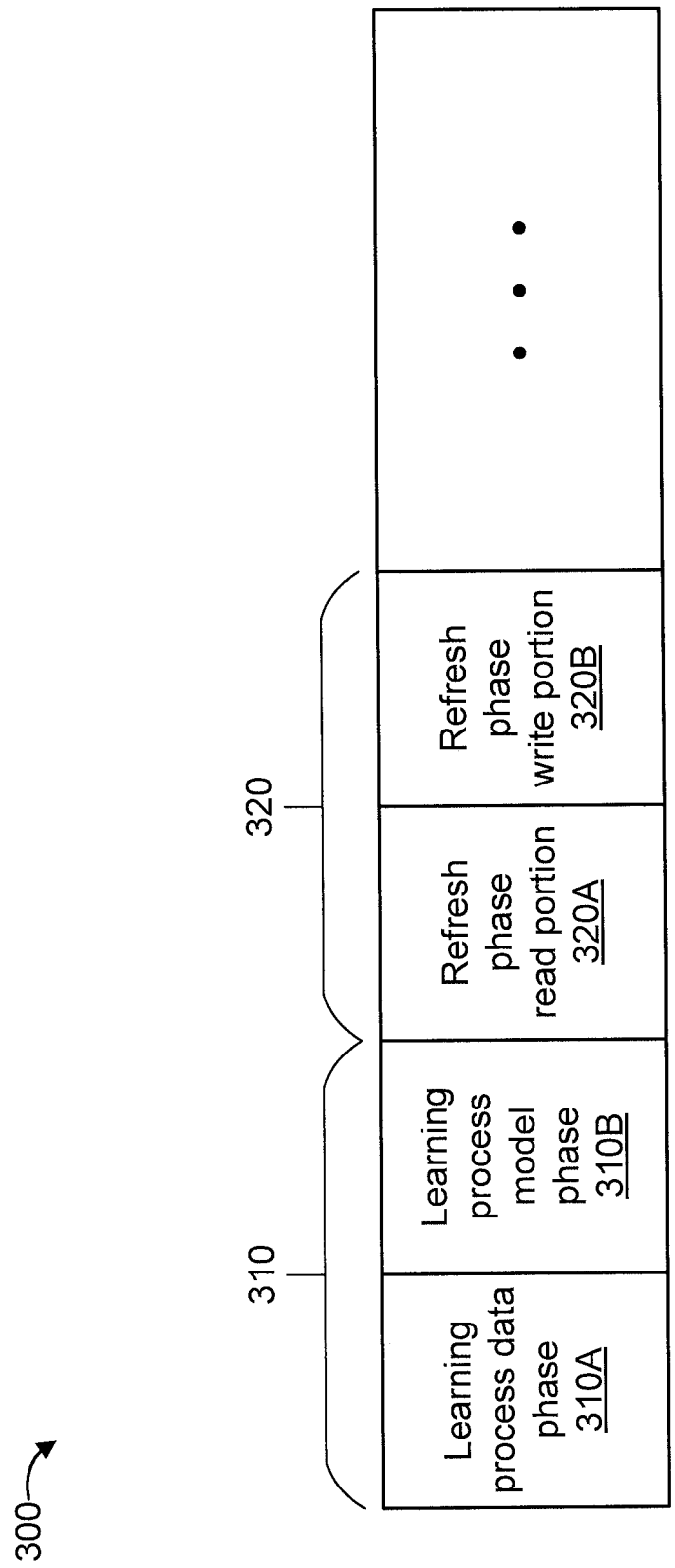
FIG. 3 is a diagram showing an exemplary learning process inter-dispersed with an exemplary refresh phase, in accordance with an embodiment of the present invention.

FIG. 3 is a diagram showing an exemplary learning process 310 inter-dispersed with an exemplary refresh phase 320, in accordance with an embodiment of the present invention.

The learning process 310 used herein involves two phases, namely a data phase 310A and a model phase 310B, for each data point (image). The data phase 310A is started by providing an image and label data to the input neurons. During the data phase 310A, positive updates on weights are made, which increases conductance Gp. The model phase 310B follows, where no input is provided to the neurons. The circuit continues updating its network based on the learned model. During this phase 310B, Gm is increased and Gp is held constant. These phases 310A and 310B are repeated for each image and label in the dataset.

To reduce the overhead of the refresh operation, a lightweight refresh phase 320 is provided. A main aspect of the refresh phase 320 is to reduce the number of PCM cells to be refreshed by selecting synapses, where Gp or Gm reached the maximum conductance and are connected to the randomly selected input neurons. As used herein, the term "any of Gp and Gm have reached their maximum conductance" means that Gp has reached its maximum conductance or Gm has reached its maximum conductance. The refresh phase 320 can be considered to include a read portion 320A and a write portion 320B, as described in further detail herein below. Transition times between phases, methods, and/or portions are not shown for the sake of brevity, but may nonetheless exist between the same.

A refresh operation is initiated at a refresh phase 320, which is inserted after learning with one or multiple images to reduce the circuit complexity and the impact to the learning activities. The neuron potentials may leak by some amount during the refresh phase; however, the impact to the neuron spiking activities is negligible because the learning will continue with a new image after the refresh. The "refresh rate" is defined herein as the number of refresh neurons per learning image, which can be controlled by the number of randomly selected input neurons at the refresh phase 320 and the refresh phase insertion timing.

Figure 4:
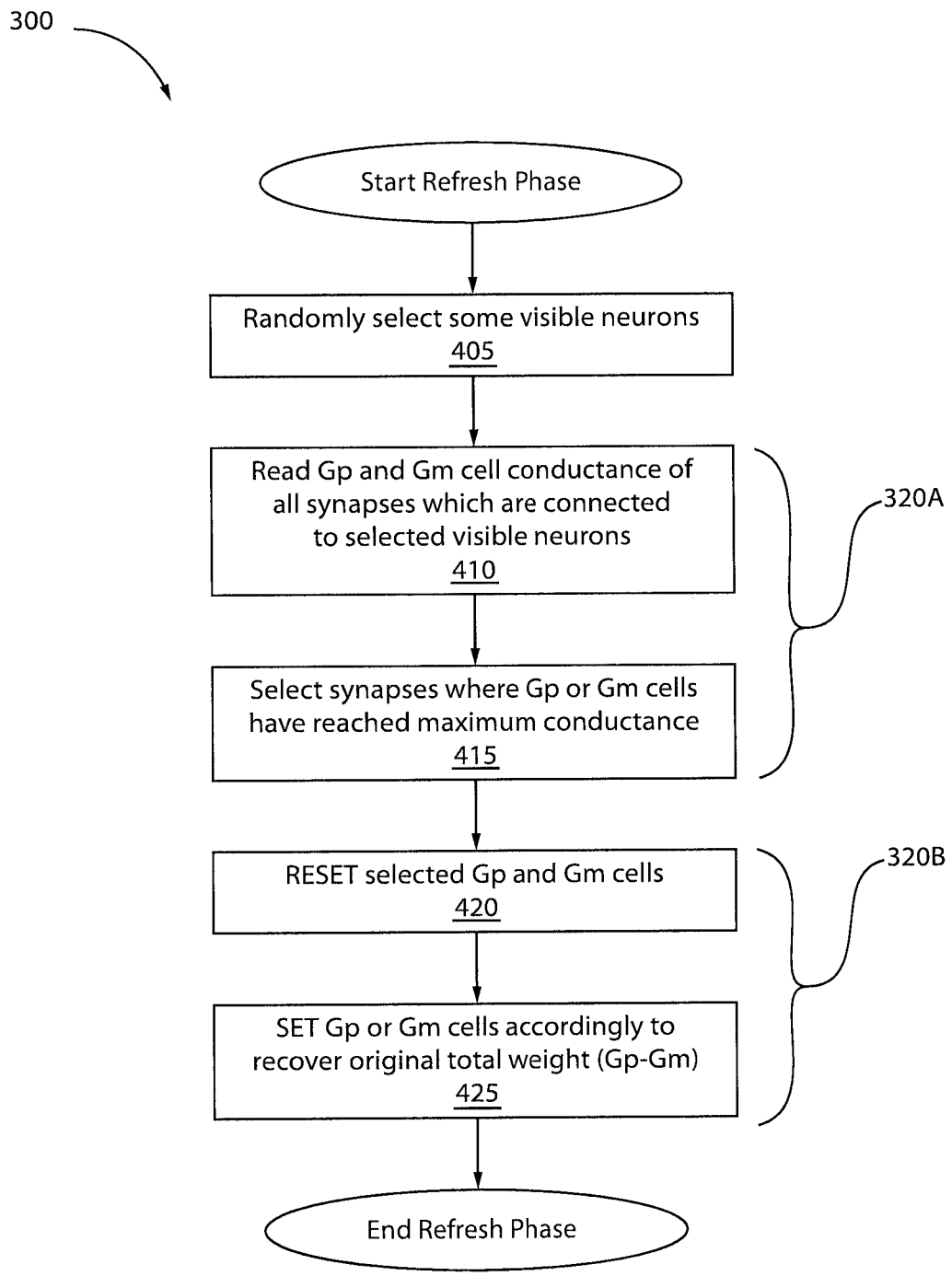
FIG. 4 is a flow diagram showing an exemplary method for performing a refresh phase, in accordance with an embodiment of the present invention.

FIG. 4 is a flow diagram showing an exemplary method 400 for performing a refresh phase, in accordance with an embodiment of the present invention. In an embodiment, method 400 can be considered to represent an implementation of refresh method 320 of FIG. 2. In particular, blocks 410 and 415 can be considered to correspond to the read portion 320A of refresh method 320, while blocks 420 and 425 can be considered to correspond to the write portion 320B of refresh method 320.

At block 405, randomly select some visible neurons.

At block 410, read Gp and Gm conductance of all synapses which are connected to the selected visible neurons.

At block 415, select synapses where Gp or Gm cells have reached maximum conductance.

At block 420, RESET selected Gp and Gm cells.

At block 425, SET Gp or Gm cells accordingly to recover the original total weight (Gp-Gm).

To reduce the refresh operation overhead further, the conductance reading operation is simplified by discretization. PCM cells are compared with some reference voltages when reading out their conductance values in block 410 of FIG. 4. As a result, conductance is discretized to some levels. This enables a quick scan of the conductance since an exact conductance value does not have to be measured. Comparison is made from the highest reference to check whether PCM cells reach maximum conductance first. If both Gp and Gm do not exceed the highest reference, then they are considered to have not reached the maximum conductance and be out of the refresh target. Only the synapses selected as refresh targets are further compared to lower references to determine the conductance of Gp and Gm for refresh.

Figure 5:
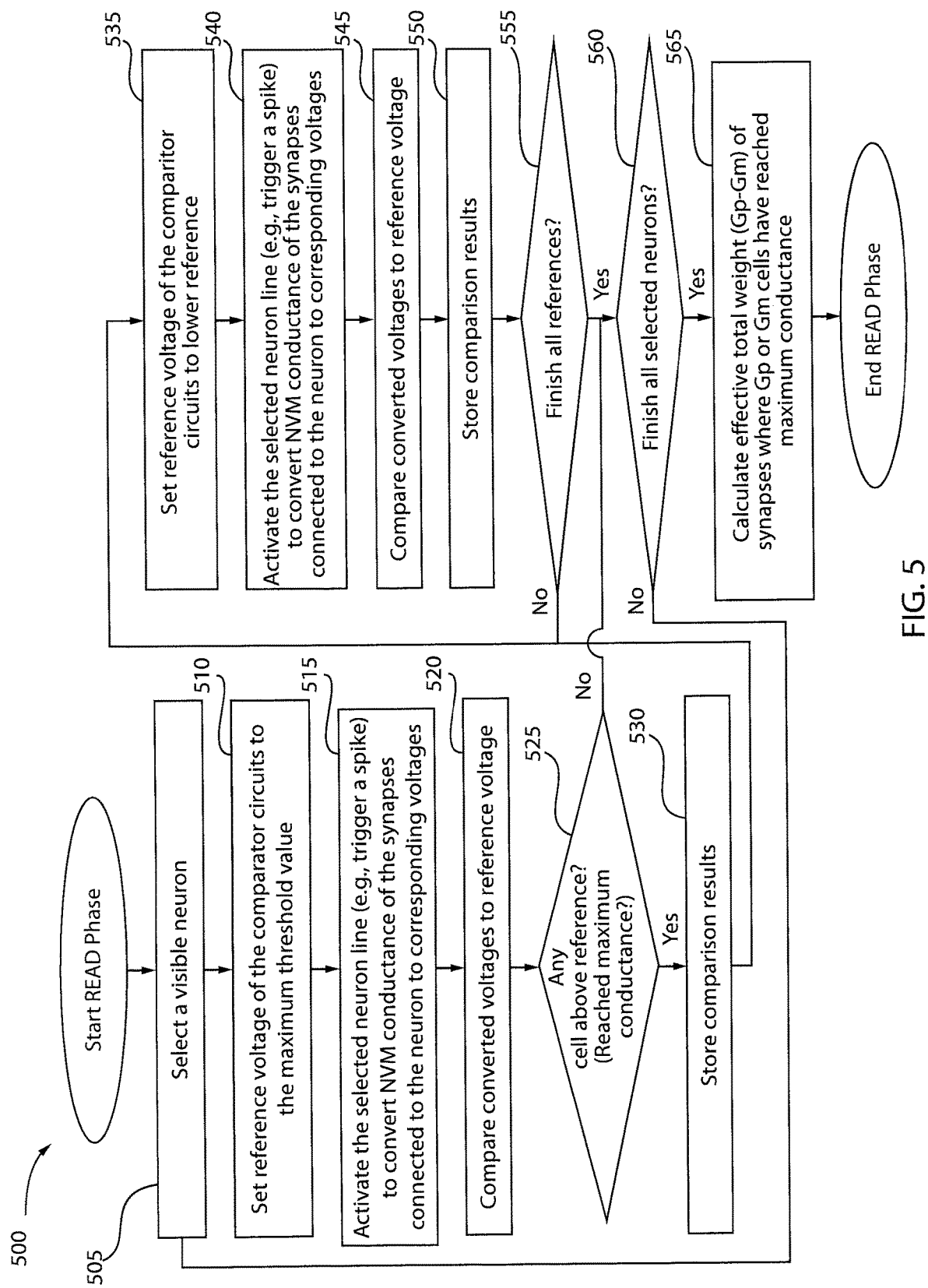
FIG. 5 is a flow diagram showing an exemplary method for reading conductance, in accordance with an embodiment of the present invention.

FIG. 5 is a flow diagram showing an exemplary method 500 for reading conductance, in accordance with an embodiment of the present invention.

At block 505, select a visible neuron.

At block 510, set the reference voltage for the comparator circuits to the maximum threshold value.

At block 515, activate the selected neuron line (e.g., trigger a spike) to convert NVM conductance of the synapses connected to the neuron to corresponding voltages.

At block 520, compare the converted voltages to the reference voltage.

At block 525, determine whether any of the cells are above the reference voltage (i.e., have reached the maximum conductance). If so, then proceed to block 530. Otherwise, proceed to block 560.

At block 530, store the comparison results.

At block 535, set the reference voltage of the comparator circuits to a lower reference voltage.

At bock 540, activate the selected neuron line (e.g., trigger a spike) to convert the NVM conductance of the synapses connected to the neuron to corresponding voltages.

At block 545, compare the converted voltages to the reference voltage.

At block 550, store the comparison results.

At block 555, determine whether all reference voltages have finished (have been used in a comparison). If so, then proceed to block 560. Otherwise, return to block 535.

At block 560, determine whether all selected neurons have finished. If so, then proceed to block 565. Otherwise, return to block 505.

At block 565, calculate the effective total weight (Gp-Gm) of the synapses where Gp or Gm cells have reached maximum conductance.

Figure 6:
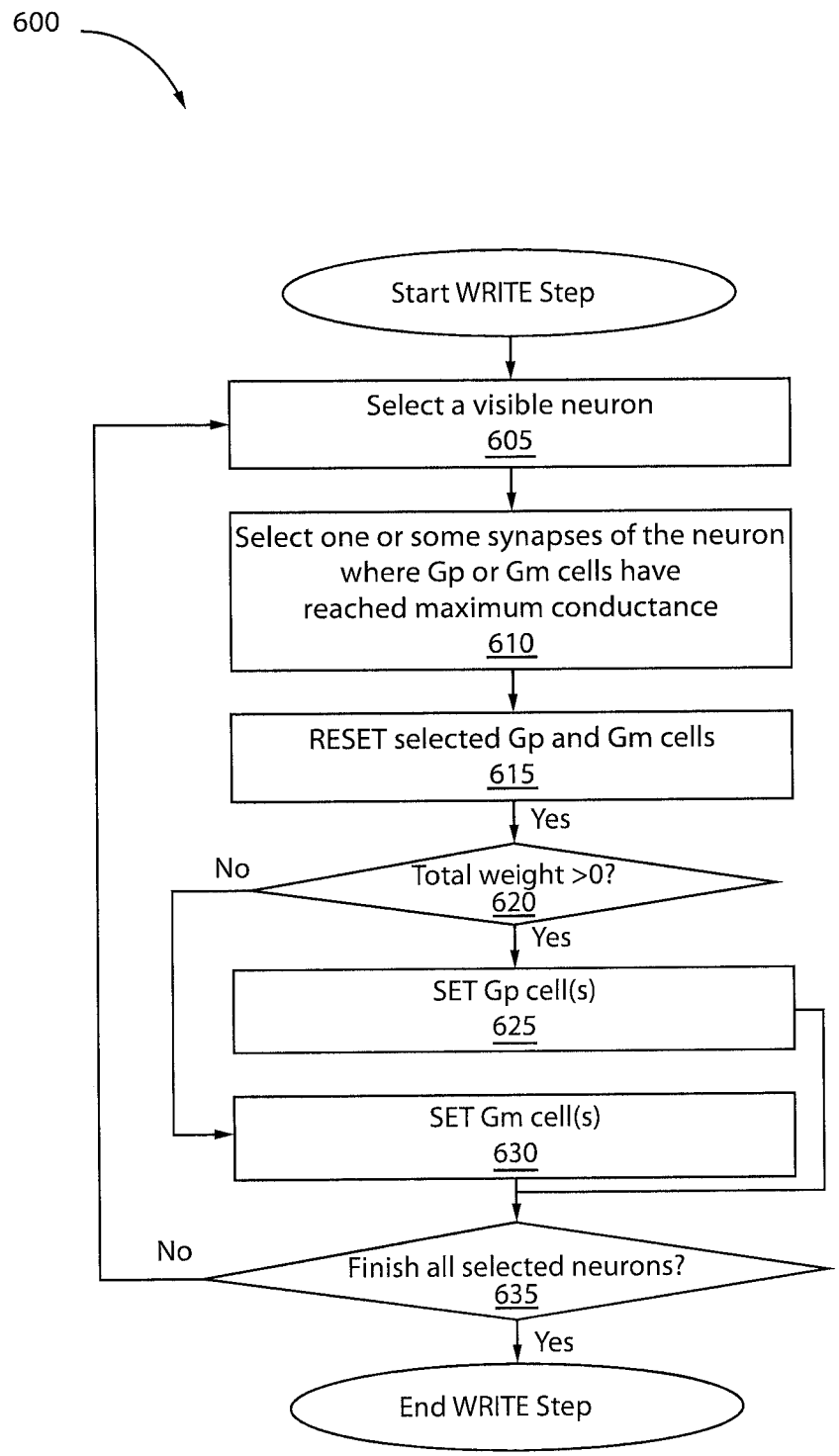
FIG. 6 is a flow diagram showing an exemplary method for writing conductance, in accordance with an embodiment of the present invention.

FIG. 6 is a flow diagram showing an exemplary method 700 for writing conductance, in accordance with an embodiment of the present invention.

At block 605, select a visible neuron.

At block 610, select one or some synapses of the neuron where Gp or Gm cells have reached maximum conductance.

At block 615, RESET the Gp and Gm cells.

At block 620, determine whether the total weight is greater than 0. If so, then proceed to block 625. Otherwise, proceed to block 630.

At block 625, set GP cell(s).

At block 630, set Gm cell(s).

At block 635, determine whether all selected neurons have finished. If so, then terminate the method. Otherwise, return to block 605.

FIGS. 7-9 are plots showing the refreshing 700 of a synapse wherein PCM cells have 100 conductance steps and the conductance discretization step is 3, in accordance with an embodiment of the present invention.

In particular, FIG. 7 is a plot showing exemplary initial Gp and Gm conductance 701 at a refresh phase, in accordance with an embodiment of the present invention. Gp and Gm are compared to reference voltages, respectively. That is, FIG. 7 shows the initial Gp and Gm states at the beginning of a refresh phase 320. Their conductance is read as discretized values by comparing to the reference voltages 25 and 75

FIG. 8 is a plot showing exemplary PCM conductance 801 after reading the PCM conductance, in accordance with an embodiment of the present invention. Gp and Gm are discretized to 100 and 50, respectively.

FIG. 9 is a plot showing exemplary conductance 901 after the refresh operation, in accordance with an embodiment of the present invention. Gp and Gm are RESET first, then only Gp is SET to keep the same total weight as G in FIG. 9. The G value after refresh can be different from the actual original G in FIG. 8 because of the discretization, however, it can be re-learned to the optimal weight during the rest of the learning. Of course, re-learning cannot fill the gap when the number of conductance steps is too small.

Figure 10:
FIG. 10 is a diagram showing tables and relating to SET pulses for implementing the present invention, in accordance with an embodiment of the present invention.

FIG. 10 is a diagram showing tables 1051 and 1052 relating to SET pulses for implementing the present invention, in accordance with an embodiment of the present invention.

The left table 1051 shows an example of a visible neuron where its four synapses A, B, C, and D require SET pulses to recover the original total weight G (Gp-Gm) to complete a refresh. To reduce the time to apply SET pulses to PCM cells, we send a SET pulse to multiple cells simultaneously. We change the target synapse (PCM cell) corresponding to their required number of SET pulses. The right table 1052 shows this operation. At the first step, we send 100 SET pulses to synapses A, B, C, and D. As synapse A received all SET pulses required, it is done with this step. In the next step, we change the target synapses to B, C, and D, and send another 100 SET pulses. Synapse B is done by this step. We repeat these steps (change target and apply pulses) until all cell connected to the visible neuron receive their required number of SET pulses.

A description will now be given regarding some of the many attendant advantages of the present invention, in accordance with one or more embodiments of the present invention.

One advantage is that the present invention can detect Gm cells that have reached the maximum conductance by reading all Gp and Gm cells connected to selected neurons at a refresh phase.

Another advantage is that the present invention reduces power consumption of neuromorphic circuits to which it is applied by only refreshing some of the neurons and by reducing the number of RESET operations.

Yet another advantage is that the present invention reduces a refresh time by selecting synapses to be refreshed.

Still another advantage is that the present invention uses low circuit overhead by only using comparators for each Gp and Gm cell line to read its conductance.

Also, another advantage is that the present invention has a negligible impact to learning accuracy.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer-implemented method for refreshing cells in a Non-Volatile Memory (NVM)-based neuromorphic circuit wherein synapses are each composed of a respective cell pair formed from a respective Gp cell and a respective Gm cell of the cells, the method comprising:
    randomly selecting multiple neurons and reading a conductance of any of the synapses connected to the multiple neurons;
    selecting any of the synapses connected to the selected multiple neurons for which the conductance has reached a maximum conductance; and
    resetting the Gp cell and Gm cell of the selected synapses, and setting, at most, one of the Gp cell and Gm cell of each of the selected synapses to recover an effective total weight of each of the selected synapses.

2. The computer-implemented method of claim 1, wherein said reading step comprises comparing the conductance of any of the synapses connected to the multiple neurons to one or more threshold voltages.

3. The computer-implemented method of claim 1, wherein said reading step further comprises discretizing the conductance prior to, and in preparation for use by, said comparing step.

4. The computer-implemented method of claim 3, further comprising modifying the recovered effective total weight to account for an error between an actual total weight and the recovered effective total weight, the error resulting from discretizing the conductance.

5. The computer-implemented method of claim 1, wherein the method is performed after an application of at least part of a learning process to the neuromorphic circuit.

6. The computer-implemented method of claim 5, further comprising controlling a refresh rate for the cells based on a number of randomly selected neurons during an execution of the method and an insertion timing of the method in the learning process.

7. The computer-implemented method of claim 5, wherein the learning process comprises a data phase followed by a model phase, wherein learning weights are updated using only positive updates during the data phase and only negative updates during the model phase.

8. The computer-implemented method of claim 1, wherein said setting step sets any of the Gp cell and Gm cell of the selected synapses that have reached the maximum conductance to recover the effective total weight of the selected synapses.

9. The computer-implemented method of claim 1, wherein the cells are Phase Change Memory (PCM) cells.

10. The computer-implemented method of claim 1, further comprising performing a write mode, the write mode comprising:
    setting only the Gp cell to a value of a total weight of a selected synapse, responsive the total weight of the selected synapse before resetting being greater than zero; and setting only the Gm cell to an absolute value of the total weight, responsive to the total weight of the selected synapse before resetting being less than zero.

11. A neuromorphic circuit, comprising:
a crossbar array including cell pairs of synaptic cells, each of the cell pairs composing a respective synapse that includes a respective Gp cell and a respective Gm cell;
a plurality of forward lines respectively connecting the synaptic cells in series to a plurality of visible neurons at ends thereof;
a plurality of backward lines respectively connecting the synaptic cells in series to a plurality of hidden neurons at ends thereof to compose a single neuron layer; and
a weight refresh circuit for cell refreshing, including pairs of comparator circuits, each of the pairs being respectively assigned to the respective Gp cell and the respective Gm cell of a given one of the cell pairs for controlling the cell pairs by:
comparing a conductance of any of the synapses connected to multiple randomly selected neurons to a comparator reference voltage corresponding to a maximum conductance;
selecting any of the synapses connected to the selected multiple neurons for which the m conductance has reached the maximum conductance; and
resetting the Gp cell and Gm cell of the selected synapses, and setting, at most, one of the Gp cell and Gm cell of each of the selected synapses to recover an effective total weight of each of the selected synapses.

12. The neuromorphic circuit of claim 11, wherein only the synapses selected as refresh targets based on having at least one of the Gp cell and the Gm cell with the maximum conductance are further compared to lower references to determine the conductance for refresh.

13. The neuromorphic circuit of claim 11, wherein the weight refresh circuit is configured to discretize the conductance prior to, and in preparation for use by, the comparing.

14. The neuromorphic circuit of claim 13, wherein the weight refresh circuit is configured to modify the recovered effective total weight to account for an error between an actual total weight and the recovered effective total weight, the error resulting from discretizing the conductance.

15. The neuromorphic circuit of claim 11, wherein the cell refreshing is performed after an application of at least part of a learning process to the neuromorphic circuit.

16. The neuromorphic circuit of claim 15, wherein the weight refresh circuit is configured to control a refresh rate for the cells based on a number of randomly selected neurons during an execution of the method and an insertion timing of the method in the learning process.

17. The neuromorphic circuit of claim 15, wherein the learning process comprises a data phase followed by a model phase, wherein learning weights are updated using only positive updates during the data phase and only negative updates during the model phase.

18. The neuromorphic circuit of claim 11, wherein the weight refresh circuit is configured to set any of the Gp cell and Gm cell of the selected synapses that have reached the maximum conductance to recover the effective total weight of the selected synapses.

19. The neuromorphic circuit of claim 11, wherein the cells are Phase Change Memory (PCM) cells.

20. The neuromorphic circuit of claim 11, wherein the weight refresh circuit is configured to perform a write mode by setting only the Gp cell to a value of a total weight of a selected synapse, responsive the total weight of the selected synapse before resetting being greater than zero, and setting only the Gm cell to an absolute value of the total weight, responsive to the total weight of the selected synapse before resetting being less than zero.

* * * * *